(12) United States Patent
Day et al.

(10) Patent No.: US 11,545,394 B2
(45) Date of Patent: Jan. 3, 2023

(54) SEMICONDUCTOR WAFER DICING PROCESS

(71) Applicant: SPTS Technologies Limited, Newport (GB)

(72) Inventors: Matthew Michael Day, Newport (GB); Samira Binte Kazemi, Newport (GB)

(73) Assignee: SPTS Technologies Limited, Newport (GB)

( * ) Notice: Subject to any disclaimer, the term of this patent is extended or adjusted under 35 U.S.C. 154(b) by 152 days.

(21) Appl. No.: 17/094,759

(22) Filed: Nov. 10, 2020

(65) Prior Publication Data
US 2021/0183703 A1 Jun. 17, 2021

(30) Foreign Application Priority Data
Dec. 12, 2019 (GB) .................................... 1918333

(51) Int. Cl.
| | |
|---|---|
| *H01L 21/02* | (2006.01) |
| *H01L 21/78* | (2006.01) |
| *H01L 21/67* | (2006.01) |
| *H01L 21/683* | (2006.01) |
| H01L 21/3065 | (2006.01) |
| H01L 21/3105 | (2006.01) |
| H01L 21/311 | (2006.01) |

(52) U.S. Cl.
CPC ........ *H01L 21/78* (2013.01); *H01L 21/67069* (2013.01); *H01L 21/67075* (2013.01); *H01L 21/67115* (2013.01); *H01L 21/6836* (2013.01); *H01L 21/3065* (2013.01); *H01L 21/31058* (2013.01); *H01L 21/31138* (2013.01); *H01L 2221/68327* (2013.01)

(58) Field of Classification Search
CPC ........... H01L 21/02076; H01L 21/3043; H01L 21/304; H01L 21/3065; H01L 21/78
See application file for complete search history.

(56) References Cited

U.S. PATENT DOCUMENTS

| | | |
|---|---|---|
| 5,501,893 A | 3/1996 | Laermer et al. |
| 8,883,615 B1 | 11/2014 | Holden et al. |
| 9,076,860 B1 * | 7/2015 | Lei .................... H01L 21/02076 |

(Continued)

OTHER PUBLICATIONS

IPO, Search Report for GB Application No. 1918333.4, dated May 28, 2020.

(Continued)

*Primary Examiner* — Jae Lee
(74) *Attorney, Agent, or Firm* — Hodgson Russ LLP

(57) ABSTRACT

A semiconductor wafer dicing process is disclosed for dicing a wafer into individual dies. Scribe lines are formed within a polymer coating to expose regions of wafer to form a pre-processed product. The pre-processed product within the chamber is plasma etched to remove the exposed regions of the wafer to separate the individual dies and form a processed product. A frame cover is then removed and the processed product, wafer frame and adhesive tape are exposed to an oxygen plasma within the chamber to partially remove an outermost region of the polymer coating, which is most heavily contaminated with fluorine, to leave a residual polymer coating on the individual dies and form a post-processed product. The residual polymer coating on the individual dies of the post-processed product is then removed.

12 Claims, 4 Drawing Sheets

(56) References Cited

U.S. PATENT DOCUMENTS

| | | |
|---|---|---|
| 10,283,381 B2 | 5/2019 | Ragunathan et al. |
| 2010/0048001 A1 | 2/2010 | Harikai et al. |
| 2012/0322233 A1 | 12/2012 | Lei et al. |
| 2014/0057414 A1 | 2/2014 | Iyer et al. |
| 2014/0213041 A1 | 7/2014 | Lei et al. |
| 2014/0242780 A1 | 8/2014 | Gauldin et al. |
| 2016/0086852 A1 | 3/2016 | Holden et al. |
| 2017/0069536 A1 | 3/2017 | Harikai et al. |
| 2019/0157100 A1 | 5/2019 | Harikai et al. |
| 2019/0221479 A1* | 7/2019 | Okita .................. H01L 21/78 |
| 2019/0371669 A1 | 12/2019 | Karasaki et al. |

OTHER PUBLICATIONS

EPO, Extended European Search Report for EP Application No. 20201507.9, dated Apr. 1, 2021.

* cited by examiner

SEMICONDUCTOR WAFER DICING PROCESS

CROSS-REFERENCE TO RELATED APPLICATIONS

This application claims priority to the U.K. Patent App. No. 1918333.4 filed Dec. 12, 2019, the disclosure of which is hereby incorporated by reference.

FIELD OF THE DISCLOSURE

The present invention relates to a semiconductor wafer dicing process.

BACKGROUND OF THE DISCLOSURE

Following the manufacture of semiconductor or microelectromechanical system (MEMS) devices on a semiconductor wafer, a wafer dicing or scribing step is required to segment the wafer into individual chips or die. Prior to the wafer dicing step the wafers are attached to a support film in order to support the discrete die post dicing step, which is in turn attached to an annular support frame. Once the dicing operation has been completed, individual die can be removed from the support film and be tested and incorporated into packaged devices.

The dicing of semiconductor wafers can be achieved by mechanical scribing, sawing, laser scribing, plasma etching or a combination of these techniques. Plasma dicing is found to improve the physical integrity and strength of the individual dies. Moreover, plasma dicing offers a narrower scribe channel upon the wafer, which enables more die to be occupied upon a wafer, and an improved layout of the integrated circuits. Framed, taped wafers are loaded into a plasma etching chamber where the individual dies are separated by etching the un-masked regions of the wafer between the dies, namely the wafer "streets". The etching process is stopped once all of the wafer material within the streets have been removed, and thus once the tape has been exposed.

During the plasma etching process it is common to use fluorine based chemistry to etch silicon wafers. U.S. Pat. No. 5,501,893 discloses a cyclic etch process, commonly described as the Bosch process, for silicon wafer dicing using $SF_6$ and Ar gas in the etch cycle. However, it has been observed that residual fluorine within the chamber following the etch process can result in a corrosion of the exposed metal contact openings or solder bumps. Even when corrosion is not immediately visible on the exposed metal, it has been found that fluorine contamination can result in poor soldering adhesion and/or a high electrical contact resistance, which can lead to a premature failure due to a deterioration of the solder/wire bond.

We have devised an improved semiconductor wafer dicing process which alleviates at least some of the above-mentioned problems.

BRIEF SUMMARY OF THE DISCLOSURE

In accordance with the present invention, there is provided a semiconductor wafer dicing process for dicing a wafer into individual dies, each die comprising an integrated circuit, the process comprising: coating a semiconductor wafer with a polymer coating; disposing the wafer comprising the coating upon an adhesive tape and mounting the tape upon a wafer frame; forming scribe lines within the polymer coating of the wafer to expose regions of wafer to form a pre-processed product; disposing the wafer frame comprising the tape and pre-processed product upon a support within a process chamber; disposing a frame cover over the wafer frame to cover at least a portion of the wafer frame and adhesive tape; plasma etching the pre-processed product within the chamber to remove the exposed regions of the wafer to separate the individual dies, to form a processed product; removing the frame cover from over the wafer frame; exposing the processed product, wafer frame and tape to an oxygen plasma within the chamber, to partially remove an outermost region of the polymer coating which is most heavily contaminated with fluorine, to leave a residual polymer coating on the individual dies, to form a post-processed product; and removing the residual polymer coating on the individual dies of the post-processed product, using a wet removal technique.

In an embodiment, a ratio of fluorine to oxygen in the post processed product, with the residual polymer coating removed, is less than 0.1.

In an embodiment, the process further comprises heating the polymer coating to bake the polymer coating prior to forming the scribe lines. The coating provides a protective layer for the laser scribe process and acts to protect the wafer surface by preventing direct exposure to the process plasma and thus minimises fluorine based metal corrosion and contamination of the wafer. In an embodiment, the polymer coating is heated to a temperature between 40° C. and 150° C. It is found that baking the polymer coating further reduces the ability of fluorine to diffuse and propagate through the coating and thus further reduces the fluorine contamination of the wafer.

In an embodiment, the adhesive tape or backing tape is coupled with the frame, which may comprise an annular disk, to provide mechanical support for the wafer.

Following the plasma etching process and before leaving the process chamber, the processed product is exposed to an oxygen plasma with a low RF bias to provide some physical component to the etch step. This exposure effectively removes the outermost or top layer of polymer that is directly exposed to the plasma, in order to remove the region of coating which is most heavily contaminated with fluorine. The exposure further removes fluorine compounds from the exposed tape and frame and to ensure that the tape and frame are effectively cleaned, the frame must not be covered, protected or shadowed during this step. It is found that a covering or shadowing of the frame or tape may result in excessive removal of the protective coating on the wafer and the retention of fluorine by-products on the surface of the frame and/or tape, which can contaminate the die.

In an embodiment, the post-processed product is removed from the chamber prior to the removal of the residual polymer coating using the wet removal technique. In this respect, it is evident that the plasma etching of the wafer and the exposure of the processed product to the oxygen plasma takes place within the same process chamber.

In an embodiment, the frame cover is disposed in thermal contact with the support following the removal of the post-processed product from the chamber, to reduce the temperature of the frame cover prior to processing the next wafer.

In an embodiment, during the step of exposing the processed product to an oxygen plasma, oxygen gas is passed through the process chamber for a duration of approximately 60-120 seconds, with a flow rate of 200-500 sccm. Furthermore, the pressure within the process chamber is maintained in the range of 50-150 mT. During this step, the support is supplied with electrical power in the range of 400-800 W.

In an embodiment, the scribe lines are formed within the polymer coating using lasing radiation. The polymer coating and residue associated with the laser scribing process are removed once dicing is complete using a wet removal technique. However, diffusion through the coating and implantation of fluorine into the coating leads to higher than background levels of fluorine being detected after removal of the coating, some of which is derived from the short term formation of a fluorine rich slurry on the surface, during the start of the wet removal step. Another potential source of fluorine contamination will be the frame and tape which are also exposed to the etching plasma but not typically protected by the coated polymer. However, as mentioned above, the contamination of the frame and tape is alleviated by exposing the tape and frame to the oxygen plasma.

DESCRIPTION OF THE DRAWINGS

An embodiment of the present invention will now be described by way of example only and with reference to the accompanying drawings in which.

DETAILED DESCRIPTION OF THE DISCLOSURE

Figure 1:
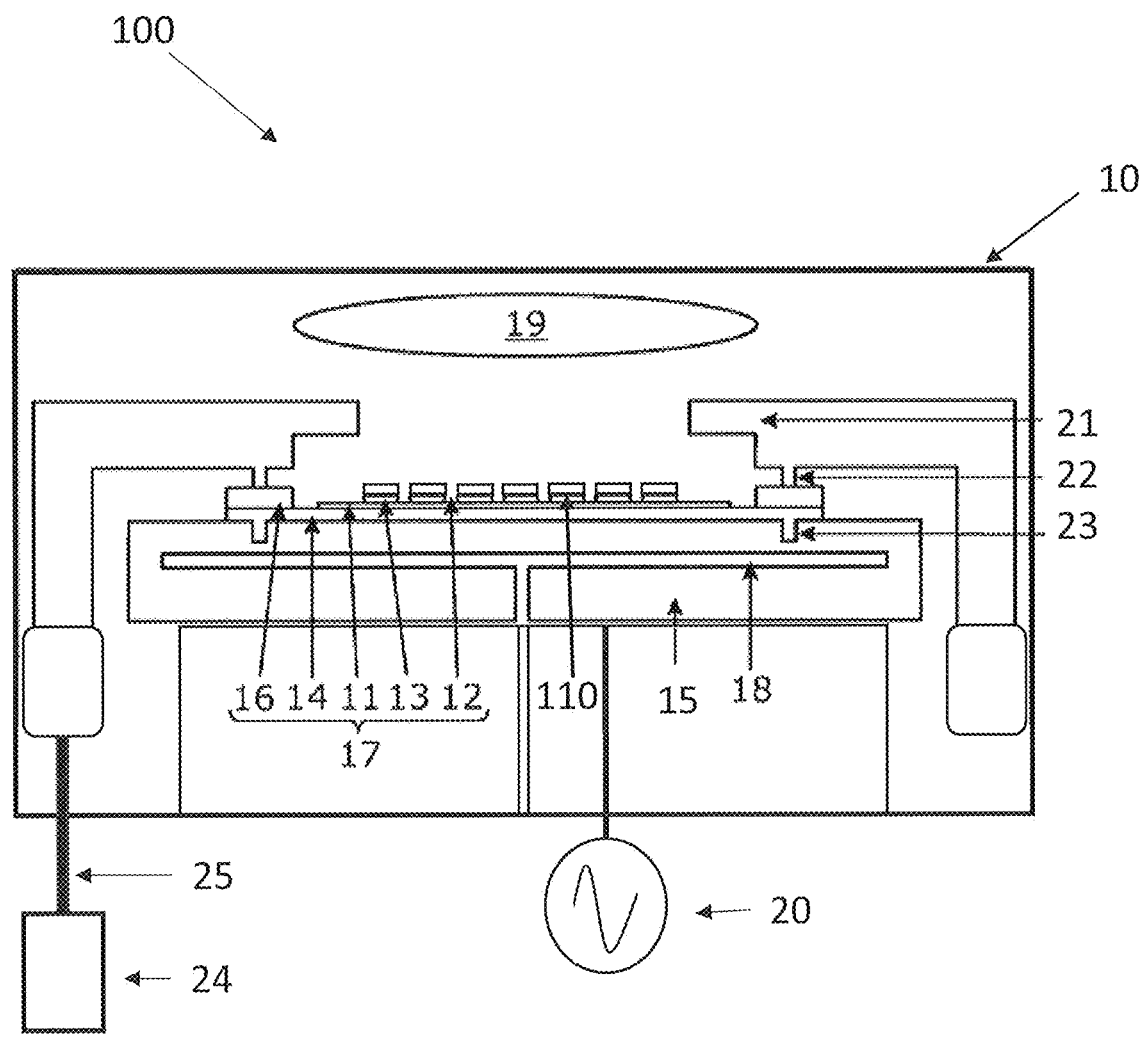
FIG. 1 is a schematic illustration of a semiconductor wafer dicing apparatus for performing the wafer dicing process according to an embodiment of the present invention.
Figure 3:
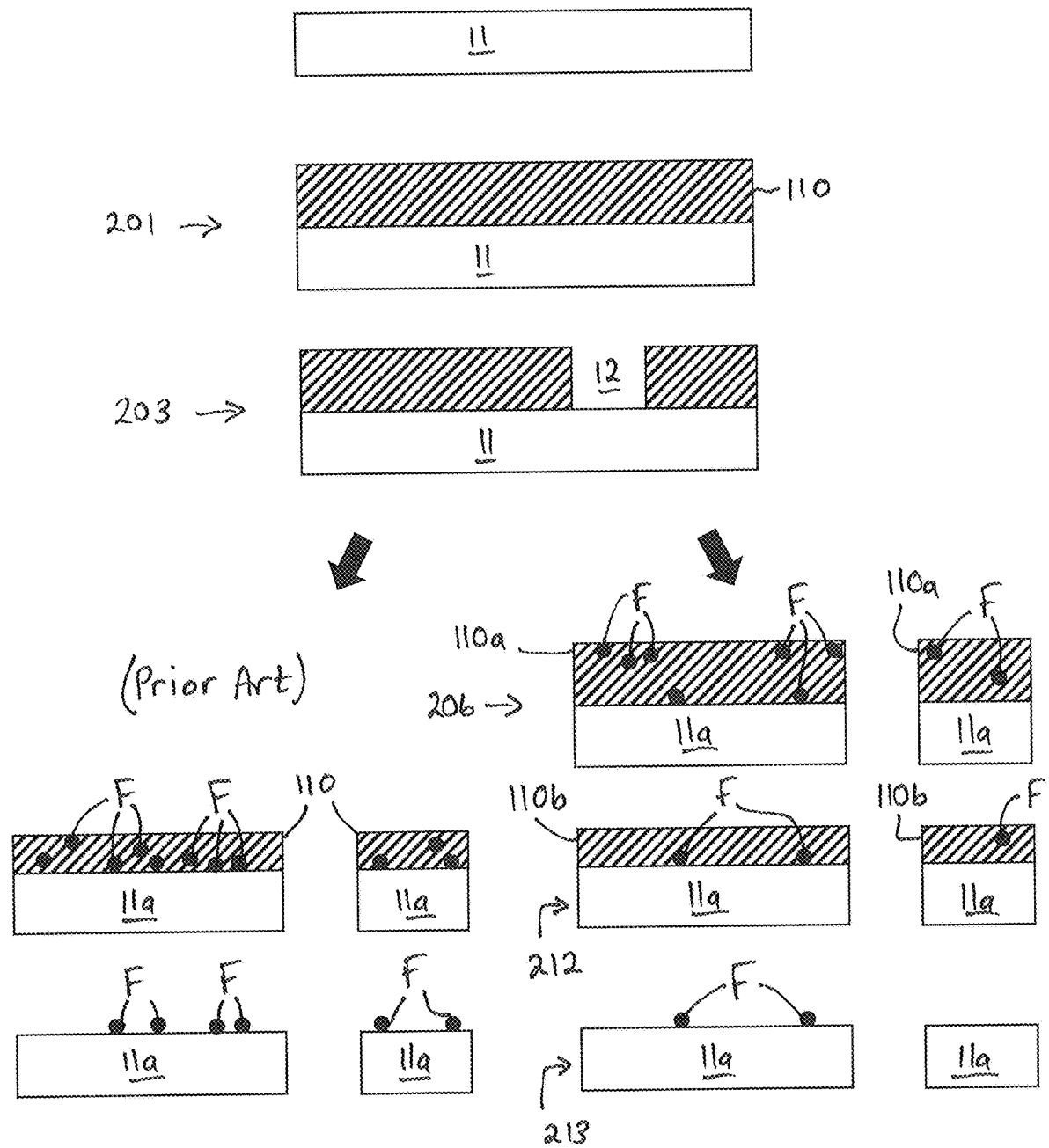
FIG. 3 is a schematic illustration of the semiconductor wafer at different stages of the process; and, FIG. 4 is a graphical illustration of the fluorine/oxygen ratio within a wafer subject to (a) a known dicing process and (b) a process according to an embodiment of the present invention. (c) represents the fluorine/oxygen ratio in a control piece, namely a piece of aluminium.

Referring to FIG. 1 of the drawings, there is illustrated an apparatus 100 for dicing a semiconductor wafer into separate dies (see FIG. 3 of the drawings).

The apparatus 100 comprises a processing chamber 10 within which is disposed a substrate or wafer 11 for processing. The wafer 11 comprises a plurality of integrated circuits 13 which are separated by street regions 12. The wafer 11 is disposed upon an adhesive tape, namely dicing tape 14, which is itself secured to a frame 16, such as an annular frame. The wafer 11, tape 14 and frame 16 collectively form a frame assembly 17 which is disposed upon a support, such as a platen or electrostatic chuck 15.

The dicing tape 14 is typically composed of polyolefin, poly(vinyl chloride), or poly(ethylene terephthalate). The annular frame 16 is typically composed of stainless steel or plastic and the surface area of the frame assembly 17 and the electrostatic chuck 15 are selected so that the electrostatic chuck 15 extends beyond the diameter of the annular frame 16 and contains internal cooling channels 18 where a coolant fluid is passed. A high voltage may be applied to the electrostatic chuck 15 via a power supply (not shown). The electrostatic clamping mechanism enables a good thermal contact to exist between the frame assembly 17 and the electrostatic chuck 15. A good thermal contact between the frame assembly 17 and the electrostatic chuck 15 helps to keep the frame assembly 17 cool during plasma treatment and prevent thermal degradation of the dicing tape 14.

The annular frame 16 and exposed tape 14 is shielded from direct exposure to the plasma 19 by use of a frame cover 21. The frame cover 21 can be positioned to make contact with the frame 16 (as shown at 22 in FIG. 1) or raised through the use of an actuator 24 and the associated lift connector 25. An RF supply 20, typically operating at 13.56 MHz, is made to the platen/electrostatic chuck 15 to provide a bias voltage to the wafer 11. Standard techniques for introducing process gas into and from the chamber 10 are employed.

Figure 2:
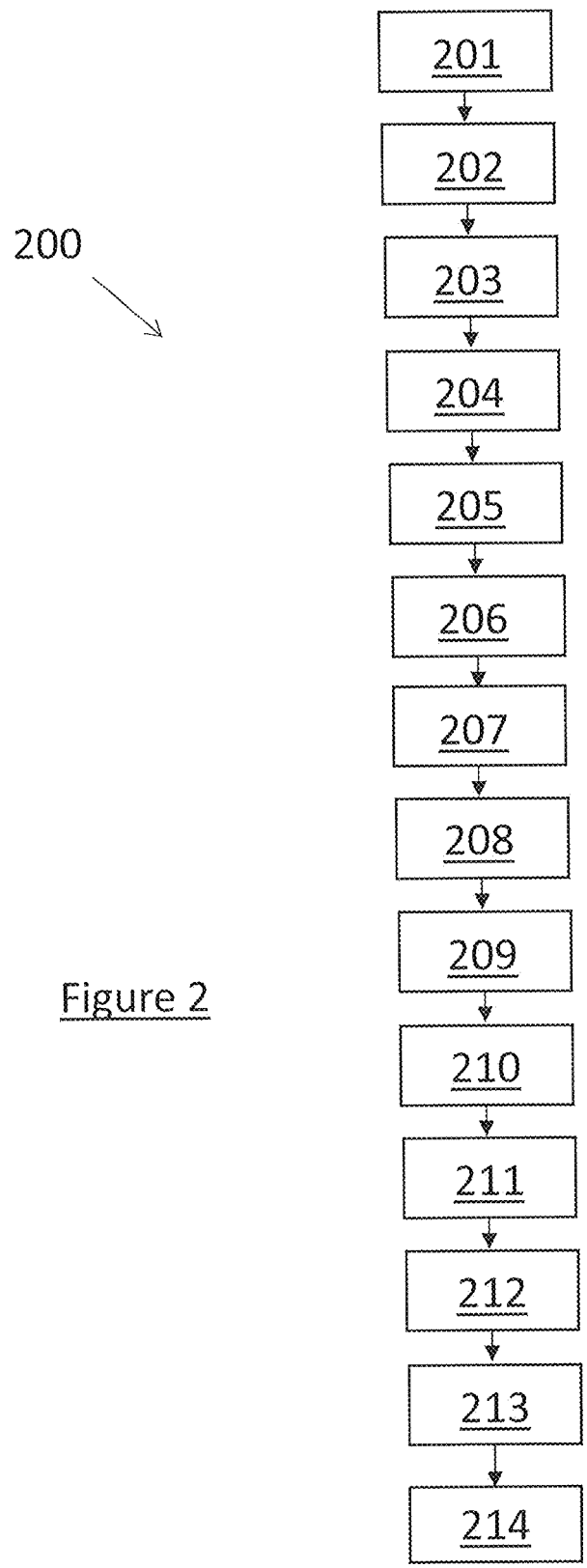
FIG. 2 is a flowchart sequencing the steps associated with a semiconductor wafer dicing process according to an embodiment of the present invention.

Referring to FIG. 2 of the drawings, there is illustrated a flow chart sequencing the steps associated with a semiconductor wafer dicing process 200 according to an embodiment of the present invention. FIG. 3 also provides a schematic illustration of the wafer at different stages in the dicing process. The semiconductor wafer 11 comprising the plurality of integrated circuits (not shown in FIG. 3) is first coated with a polymer coating 110, such as a water soluble coating, at step 201. This may be achieved by spin coating or spray coating of the polymer upon the wafer 11 to achieve a uniform coating thickness. The polymer coating 110 is then heated at step 202 within the range 40° C.-150° C., to effectively bake the coating 110 and reduce the susceptibility of the coating to contamination and penetration by the process gases.

Following the baking process, the wafer 11 is disposed upon an adhesive tape 14 disposed upon a wafer frame 16, such as an annular frame, to provide mechanical support to the wafer 11. The adhesive tape 14 or backing tape serves to hold the wafer 11 in place relative to the frame 16, so that it can be suitably aligned, and also secures the dies following the dicing process, so that they can be easily manipulated.

The wafer, tape, frame assembly 17 is then subject to a scribing operation at step 203, whereby the regions of the coating 110 which are disposed adjacent the wafer streets 12, namely the regions between the integrated circuits, are removed. In an embodiment, this removal is achieved using a laser (not shown). A laser beam is focused upon the coating 110 using a lens and beam steering arrangement (not shown) and the laser beam is scanned across the coating 110 on wafer 11 to scribe the desired pattern within the coating 110 and thus expose an upper surface of the wafer 11, to form a pre-processed product or work-piece.

The wafer frame 16 comprising the tape 14 and pre-processed product is then loaded into the processing chamber 10 at step 204 and placed upon the electrostatic chuck 15. A frame cover 21 is then disposed upon the frame assembly 17 to cover at least a portion of the frame 16 and tape 14. A Bosch cyclic etch process is subsequently performed using etching gases, such as a combination of $SF_6$ and Ar, which are introduced into the chamber 10 at step 205. A plasma generating arrangement (not shown) is subsequently activated at step 206 to generate a plasma 19. It is to be appreciated that the plasma may be generated using different techniques, including but not limited to an inductive coupling technique whereby electromagnetic energy is inductively coupled within the chamber 10 via a coil (not shown) disposed around the chamber 10. An electrical bias is subsequently applied to the wafer 11 via the electrostatic chuck 15 via an electrical generator 20, at step 207. The electrical bias facilitates the interaction between the plasma species and the exposed wafer regions to plasma etch the exposed regions of the wafer 11 and effectively dice the wafer 11 into the constituent dies 11a, thereby forming a processed product. It is found that the frame cover 21 reduces the heat load on the frame 16 and tape 14 and reduces the etch rate of the tape 14. Frame cover 21 is retained by clamping pins 22 which can locate into recesses 23 in the electrostatic chuck 15 when the frame assembly 17 is not present, so the frame cover 21 can form a good thermal contact with the chuck 15 to facilitate the removal of heat from the frame cover 21.

Following the etching process, the fluorine based etching gases are removed from the chamber 10 at step 208 and the frame cover 21 is lifted from the frame assembly 17 at step 209 by actuator 24, connected through 25, to expose the frame 16 and tape 14. Oxygen gas is then flushed through the chamber 10 at a rate of approximately 200-500 sccm within the range of 50-150 mT, at step 210. The process plasma is then activated at step 211, for a duration of 60-120 seconds and an electrical bias, in the range of 400-800 W RF, is applied to the wafer 11 via the electrostatic chuck 15 using the electrical generator 20. The oxygen plasma species interact with the processed product and effectively etch an outermost layer 110a of the coating 26, namely the region of the coating which is most heavily contaminated by the etching gas, such as fluorine F, at step 212. The oxygen plasma species further interact with the exposed frame 16 and tape 14 to remove any fluorocarbon contaminants from the surface thereof.

The electrical supply to the plasma generating arrangement (not shown) and electrostatic chuck 15 are tuned to obtain a substantially uniform etch rate of the coating across the processed product. The coating 110 is only partially removed during the oxygen plasma etching step to leave a residual polymer coating layer 110b upon the wafer 11 and thus further protect the wafer 11 from any remnant fluorine present in the chamber 10 from the previous processing steps, otherwise the chamber 10 itself may contaminate an accidentally exposed surface of the wafer 11. It is important to note that the fluorine contaminated layer on the tape 14 and frame 16 is also a significant source of fluorine based contamination, particularly during the subsequent step of wet removal of the coating, and during storage. The minimum thickness of residual coating 110b required to suitably protect the wafer 11 depends on the coating itself. It is generally required to remove the minimum amount necessary to achieve the optimum protection. For a coating 110 which is relatively effective at blocking fluorine migration, <1 μm of coating thickness removal may sufficient, however, a coating 110 with a poorer blocking effectiveness may require a removal to a greater depth in order to mitigate the effects of fluorine contamination.

The residual coating 110b on the post-processed product thus serves to protect the wafer 11 from contamination by background fluorine within the chamber 10, particularly while the post-processed product remains in the chamber 10. Following the oxygen plasma etching step, the frame assembly 17 is removed from the chamber 10 and the residual coating 110b on the post-processed product is removed using a wet removal technique, at step 213. The frame cover 21 may then be lowered onto the chuck 15 at step 214 to facilitate the cooling of the frame 21 by virtue of the thermal contact with the chuck 15, which itself is subject to a cooling via the internal cooling channels 18.

Figure 4:
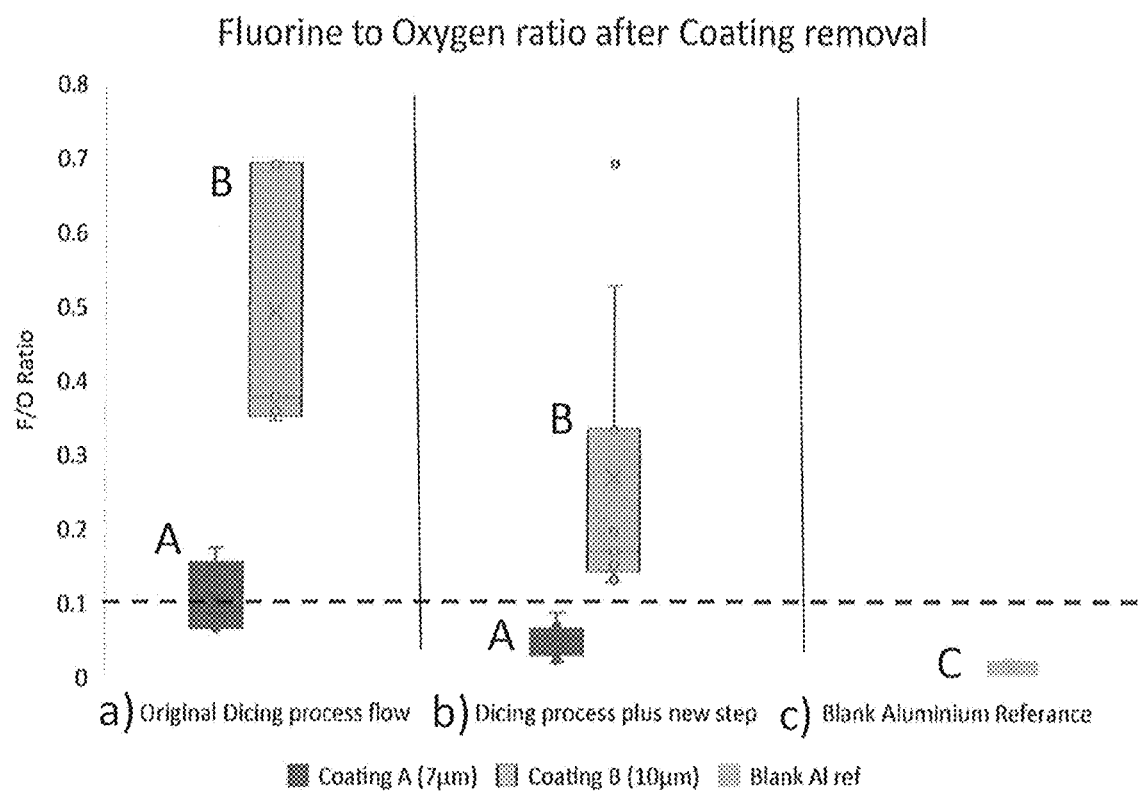

Fluorine contamination is typically quantified by the ratio of fluorine to oxygen. Measuring a ratio rather than a percentage concentration improves repeatability between samples as it is relatively insensitive to the presence of other contaminants or run to run measurement variability. Referring to FIG. 4 of the drawings, there is illustrated a graphical illustration of the reduction in the fluorine/oxygen (F/O) ratio at the top surface of a diced wafer that is achieved with the process of the present invention, compared with traditional dicing processes involving wet removal of the coating. The F/O ratio may be determined via energy-dispersive x-ray spectroscopy or x-ray photoelectron spectroscopy, for example. FIG. 4a shows the F/O ratio, determined by energy-dispersive x-ray spectroscopy, of a wafer which has been subject to the known process of plasma etching to dice the wafer followed by a wet removal of the coating, for two different coatings labelled A and B. Coatings A and B are both water soluble coatings of different formulations which are 7 μm and 10 μm thick prior to the plasma etch process. In FIG. 4b the F/O ratio is shown for the same two coatings which have been subject to the process according to the above described embodiment, which includes the $O_2$ plasma etching step. FIG. 4c illustrates the F/O ratio for a control, namely a block of aluminium, which is not exposed to plasma steps. The maximum acceptable target F/O ratio of 0.1 is clearly indicated with the dashed line.

FIG. 4 illustrates the benefits of this new process for the two coating types: coating A is an effective barrier layer 7 μm thick which has had ~0.6 μm removed during the $O_2$ plasma etching step, and coating B is a low blocking efficiency coating, 10 μm thick, which has had ~2.2 μm removed during the $O_2$ plasma etching step, in order to measure a detectable benefit. Oxygen plasma processing which excessively thins the coating 110, or at the extreme removes the polymer coating entirely 110, will reverse the benefit and lead to an increase in fluorine bonded to the wafer surfaces. It is evident that the F/O ratio is markedly reduced for the process which includes the oxygen plasma etching followed by wet removal, as demonstrated in FIG. 4b, compared with the traditional process of wet removal alone, as demonstrated in FIG. 4a.

What is claimed is:

1. A semiconductor wafer dicing process for dicing a wafer into individual dies, each die comprising an integrated circuit, the process comprising:
   coating a wafer with a polymer coating;
   disposing the wafer comprising the coating upon an adhesive tape and mounting the tape upon a wafer frame;
   forming scribe lines within the polymer coating of the wafer to expose regions of the wafer thereby forming a pre-processed product;
   disposing the wafer frame comprising the adhesive tape and the pre-processed product upon a support within a process chamber;
   disposing a frame cover over the wafer frame to cover at least a portion of the wafer frame and the adhesive tape;
   plasma etching the pre-processed product within the process chamber to remove the exposed regions of the wafer and to separate the individual dies thereby forming a processed product;
   removing the frame cover from over the wafer frame;
   exposing the processed product, the wafer frame and the adhesive tape to an oxygen plasma within the process chamber to partially remove an outermost region of the polymer coating which is most heavily contaminated with fluorine and to leave a residual polymer coating on the individual dies thereby forming a post-processed product; and
   removing the residual polymer coating on the individual dies of the post-processed product using a wet removal technique.

2. The semiconductor wafer dicing process according to claim 1, wherein a ratio of fluorine to oxygen in the post-processed product with the residual polymer coating removed is less than 0.1.

3. The semiconductor wafer dicing process according to claim 1, further comprising heating the polymer coating to bake the polymer coating prior to forming the scribe lines.

4. The semiconductor wafer dicing process according to claim 3, wherein the polymer coating is heated to a temperature between 40° C. and 150° C.

5. The semiconductor wafer dicing process according to claim 1, wherein the post-processed product is removed from the process chamber prior to the removal of the residual coating using the wet removal technique.

6. The semiconductor wafer dicing process according to claim 5, wherein the frame cover is disposed in thermal contact with the support following the removal of the post-processed product from the chamber whereby a temperature of the frame cover is reduced prior to processing a next wafer.

7. The semiconductor wafer dicing process according to claim 1, wherein during the step of exposing the processed product to the oxygen plasma, oxygen gas is passed through the process chamber with a flow rate of 200-500 sccm.

8. The semiconductor wafer dicing process according to claim 1, wherein during the step of exposing the processed product to the oxygen plasma, a pressure within the process chamber is maintained in a range of 50-150 mT.

9. The semiconductor wafer dicing process according to claim 1, wherein during the step of exposing the processed product to the oxygen plasma, oxygen gas is passed through the process chamber for a duration of 60-120 seconds.

10. The semiconductor wafer dicing process according to claim 1, wherein during the step of exposing the processed product to the oxygen plasma, the support is supplied with electrical power in the range of 400-800 W.

11. The semiconductor wafer dicing process according to claim 1, wherein the scribe lines are formed within the polymer coating using lasing radiation.

12. An apparatus configured to perform the semiconductor dicing process according to claim 1.

* * * * *